(12) United States Patent
Liu (10) Patent No.: US 7,151,669 B2
(45) Date of Patent: Dec. 19, 2006

(54) CONFIGURABLE HEAT SINK WITH MATRIX CLIPPING SYSTEM

(76) Inventor: Kechuan K Liu, 197 Alhambra Way, Weston, FL (US) 33326

( * ) Notice: Subject to any disclaimer, the term of this patent is extended or adjusted under 35 U.S.C. 154(b) by 346 days.

(21) Appl. No.: 10/885,317

(22) Filed: Jul. 6, 2004

(65) Prior Publication Data
US 2005/0013120 A1   Jan. 20, 2005

Related U.S. Application Data

(60) Provisional application No. 60/488,858, filed on Jul. 18, 2003.

(51) Int. Cl.
*G06F 1/20*  (2006.01)
(52) U.S. Cl. ............... 361/707; 361/704; 165/80.3; 165/185
(58) Field of Classification Search ............ 361/707, 361/704; 165/80.3, 185
See application file for complete search history.

(56) References Cited

U.S. PATENT DOCUMENTS

| | | | |
|---|---|---|---|
| 5,960,861 A | | 10/1999 | Price et al. |
| 5,991,152 A | * | 11/1999 | Chiou ................... 361/704 |
| 6,128,191 A | | 10/2000 | Bell et al. |
| 6,201,699 B1 | | 3/2001 | Ayres et al. |
| 6,219,239 B1 | * | 4/2001 | Mellberg et al. ............ 361/704 |
| 6,252,773 B1 | * | 6/2001 | Werner ....................... 361/704 |
| 6,262,893 B1 | | 7/2001 | Liu |
| 6,310,776 B1 | * | 10/2001 | Byrne et al. ................. 361/707 |
| 6,381,844 B1 | * | 5/2002 | Bollesen .................... 165/80.3 |
| 6,707,674 B1 | * | 3/2004 | Bryant et al. ................ 361/704 |
| 6,746,261 B1 | * | 6/2004 | Petit et al. ................... 361/704 |
| 6,822,869 B1 | * | 11/2004 | Huang et al. ................ 361/704 |
| 6,867,975 B1 | * | 3/2005 | Kashiwagi ................... 361/704 |
| 6,904,650 B1 | * | 6/2005 | Chen et al. .................... 24/517 |

* cited by examiner

*Primary Examiner*—Lisa Lea-Edmonds (57) ABSTRACT

A heat sink apparatus for use with electronic components comprises a base frame, a clipping system and a plurality of supporting members. The base frame and the clipping system and the supporting members are of unitary construction. The base frame is configured to have "i" repeatable channels with fins extended from or attached to its outside surfaces. The clipping system comprises a matrix [i, j] set of i×j spring clips. Each spring clip is configured to have partially constrained with the base frame, and to flex about an axis resiliently to effect an engaged relation to substantially fixedly maintain the electronic component in abutting relation with the inside walls of the channel. The supporting members are configured to have fixed connection with the base frame and be solderable. The heat sink apparatus's capacity of holding electronic components is scalable to accommodate upgrades and design changes of electronic products.

20 Claims, 6 Drawing Sheets

CONFIGURABLE HEAT SINK WITH MATRIX CLIPPING SYSTEM

This patent application is associated to the Provisional Patent Application filed on Jul. 18, 2003, Application No. 60/488,858.

CROSS-REFERENCE TO RELATED APPLICATIONS

None

STATEMENT REGARDING FEDERAL SPONSORED RESEARCH OR DEVELOPMENT

Not Applicable

FIELD OF THE INVENTION

This invention generally relates to the art of heat sink assemblies and, particularly, to a configurable heat sink assemblies having an embedded, scalable clipping system comprising a matrix [i, j] set of i×j spring clips for attaching electronic components thereto heat sink body.

BACKGROUND OF THE INVENTION

Heat sinks or heat sink assemblies of a wide variety of designs have been employed to dissipate heat generated by electronic components and devices on printed wiring or circuit boards to prevent the electronic components and devices from failure. More than ever before, today's electronic products are reducing the size and cost, increasing power and speed dramatically, and upgrading frequently. So that the heat sinks or heat sink assemblies used in electronic packaging must be smaller size, larger surface areas, easier assembly, lower cost and scalable to meet the trends.

Generally a heat sink is a piece of part made of any thermal conductive materials, such as Copper, Aluminum and Steel, etc. For better performance and more cost effective, a heat sink usually has extended surface areas, called fins, and is made of Aluminum. A heat sink assembly comprise of at least one heat sink and some attachments, such as clip or clamp, pins or tabs, and/or fasteners, to attach electronic components or devices onto heat sink body, and to mount the heat sink assembly into a printed wiring or circuit board.

On a typical printed wiring or circuit board, there may be a number of heat generating electronic components or devices. Conventionally a couple of heat sink assemblies may be used and mounted in different orientations depending upon the circuit design and&layout requirements to dissipate the heat. If the electronic product is required for more power or higher speed, the heat sink on the printed wiring or circuit board may need to be changed in order to dissipate more heat generated by the devices. Thereby the circuit may need to be redesigned and re-laid out.

In order to improve size, surface areas, ease of assembly and cost, more and more heat sink apparatus are constructed unitarily. An example of the latter may be seen in U.S. Pat. No. 6,201,699 and the Max Clip System™ heat sink from AAVID. These extruded heat sinks with solderable pins pressed in are good examples for improving ease of assembly and scalability, but are limited in the size, performance, mounting orientation and unitary construction. The clips for attaching electronic components or devices are separated parts, and the heat sink can only be scalable in one direction. In other words, the numbers of electronic components on heat sink can be increased only in one direction without using separate heat sinks.

Accordingly, what is needed is in the art of a smaller size, larger surface areas, lower cost, universally mountable, scalable and unitarily constructed heat sink apparatus which incorporates the clipping and mounting mechanism, and be ready for attaching electronic components or devices thereon, and universally mounted onto printed wring or circuit board without requiring extra parts.

SUMMARY OF THE INVENTION

A heat sink apparatus for use with electronic components or devices comprises a base frame and a clipping system and a polarity of supporting members. The base frame is configured to have a channel intercepted with a cylindrical cut at its bottom center and a plurality of solderable tabs attached on at least one sidewall of the channel. The channel is repeatable transversely with "i" as the numbers of channels, i=1 means only one channel in the base frame. The base frame further has fins attached to its outside surfaces. The base frame and the clipping system and supporting members are of unitary and compact construction. The clipping system comprises a matrix [i, j] set of i×j spring clips, each spring clip is configured to flex about its axis resiliently to effect an engaged relation with both sidewalls of the channel to substantially fixedly maintain the electronic components in abutting relation with the sidewalls of channel. The heat sink capacity of attaching electronic components is scalable transversely and longitudinally by altering the elements i and j in the matrix [i, j] of the clipping system to accommodate upgrades and design changes of electronic products The unitary construction for a heat sink apparatus according to the present invention avoids the necessity for additional assembly parts such as screws, nuts, bolts, washers and adhesives. The heat sink apparatus of the present invention also avoids the requirement for such separate attachments as spring clips and fixtures suitable for clipping mechanism and stabilizing heat sink assembly before being fixed on a printed wiring or circuit board. In such all-in-one solution heat sink apparatus, it greatly reduces the assembly, documentation and inventory work.

It is a further object of the present invention to provide a heat sink apparatus that the assembly of clipping system, supporting members and the base frame together to create unitary construction uses the very cost effective operations without requiring expensive tooling, skilled workers and complicated fixtures. It is, therefore, an object of the present invention to provide a heat sink apparatus that is of unitary construction using cost-effective secondary assembly operation.

It is yet a further object of the present invention to provide a heat sink apparatus that may be assembled with an associated electronic component without unnecessary assembly steps, such as ancillary process operations like drilling or tapping apertures.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

DETAILED DESCRIPTION OF THE INVENTION

Figure 1A:
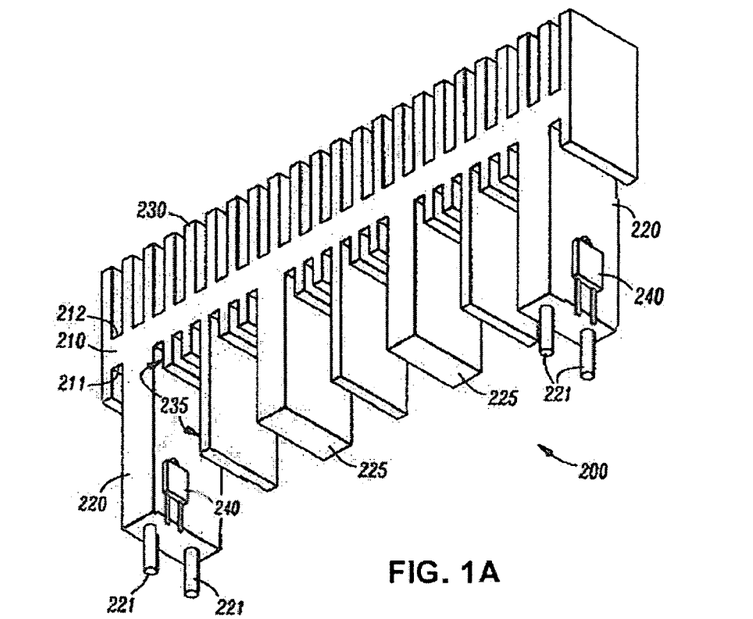
FIGS. 1A–1B illustrate embodiments of prior art heat sinks.
Figure 1B:
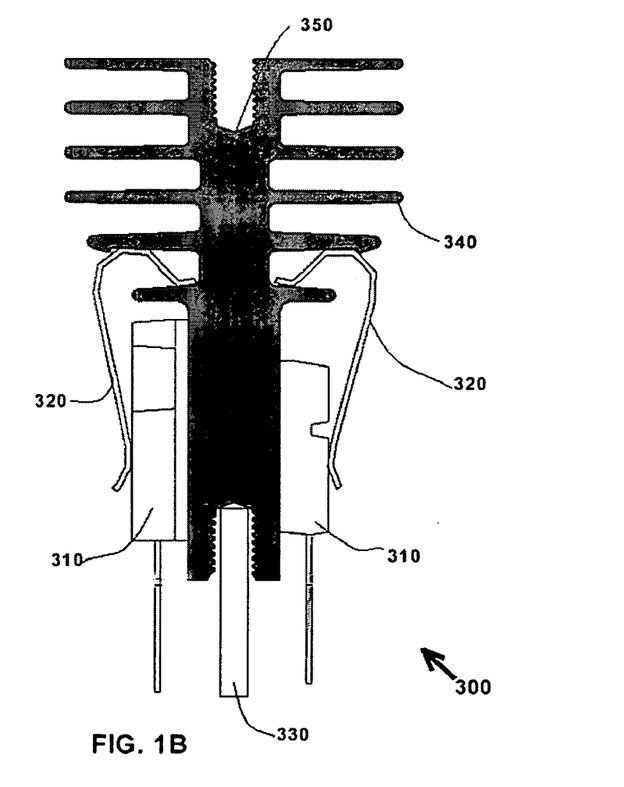

Referring initially to FIGS. 1A and 1B, illustrated are examples of prior art heat sinks 200, 300. The prior art heat sink 200 illustrated in FIG. 1A has a longitudinal spine 210 with an opposing first side 211 and second side 212. Extending from the first side 211 of the spine 210 are electronic device support legs 220, 225, configured so that each leg 220, 225 can support two electronic devices or components on opposing side of the support legs 220, 225, as shown, an electronic component 240 mounted a clip (not shown here), Multiple cooling fins 230, 235 are extending from the second side 212 and first side 211 of the spine 210. Apparently this heat sink has the disadvantages of: 1) fixed orientation mounting with given air flow direction to manipulate the printed wiring or circuit layout; 2) lack of unitary construction since the clip is a separated part; 3) secondary machining operation is required to make the port for receiving pin 221, if the heat sink is manufactured by extrusion; and 4) the heat sink capacity for attaching electronic components is not scalable longitudinally (in the in and out paper directions).

FIG. 1B illustrates another prior art heat sink 300. This heat sink 300 is designed so that heat-generating components 310 are mounted directly to the heat sink body 350 using clips 320. The heat sink 300 can be fastened to a circuit or wiring board by soldering via pin 330. This heat sink 300 also has multiple cooling fins 340 that extend from both sides of the heat sink body 350. FIG. 1B reveals that this heat sink has the disadvantages of: 1) fixed orientation-mounting with given air flow direction to manipulate the printed wiring or circuit layout; 2) lack of unitary construction since the clip is a separated part; 3) heat sink assembly can not stand straight on printed wiring or circuit board before soldering, so fixtures are required; and 4) the heat sink capacity for attaching electronic components is not scalable transversally (in left and right directions).

It is common practice for several heat sinks to be required on a circuit or wiring board in order to control the heat generated by multiple devices and components. It is also common that heat sink to be required to be mounted in different orientations on a circuit or wiring board to meet the circuit layout and performance. Because heat sinks generally occupy larger space than associated components on a printed wiring or circuit board, it is highly desirable that a heat sink design be compact, scalable and universally mountable while controlling heat from several devices that would otherwise require multiple heat sinks.

It is obvious that a scalable and universally mountable heat sink can reduce the part counts in a circuit or wiring board assembly, therefore the cost associated to manufacturing, assembly and parts will be reduced. The present invention addresses the space, weight, scalability, flexibility and cost problems discussed above that are inherent when multiple heat sinks are used, without impairing the ultimate objective of heat control.

Figure 2:
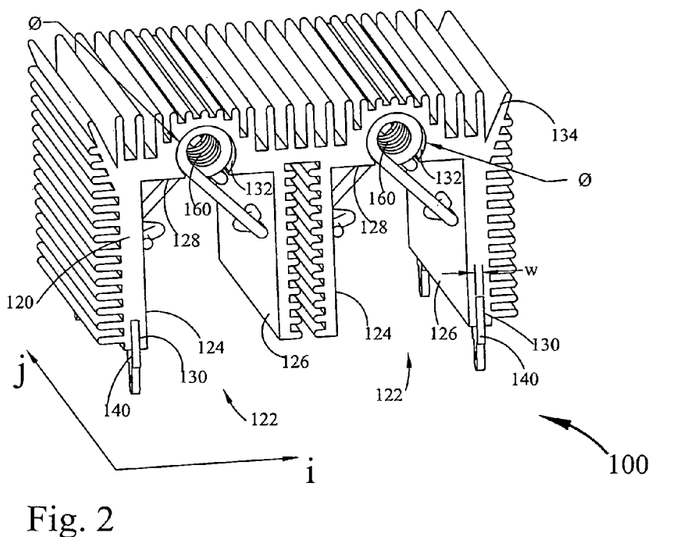
FIGS. 2–3 are perspective drawings of the top and bottom views of an embodiment of the present invention before assembly with electronic components.
Figure 3:
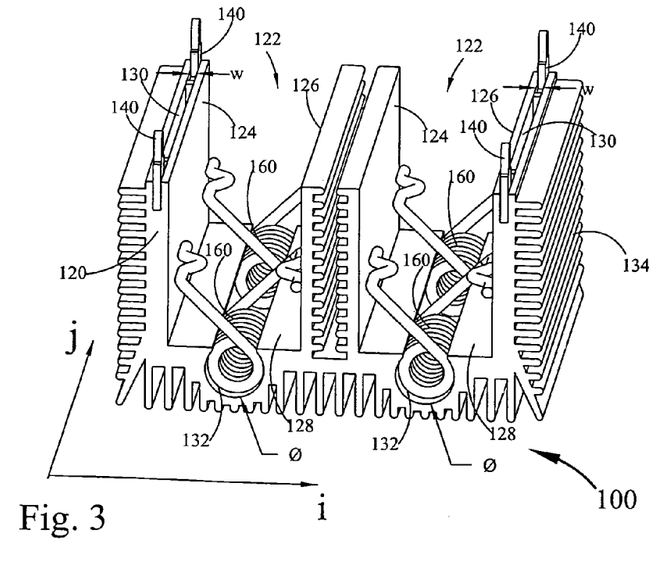
Figure 6A:
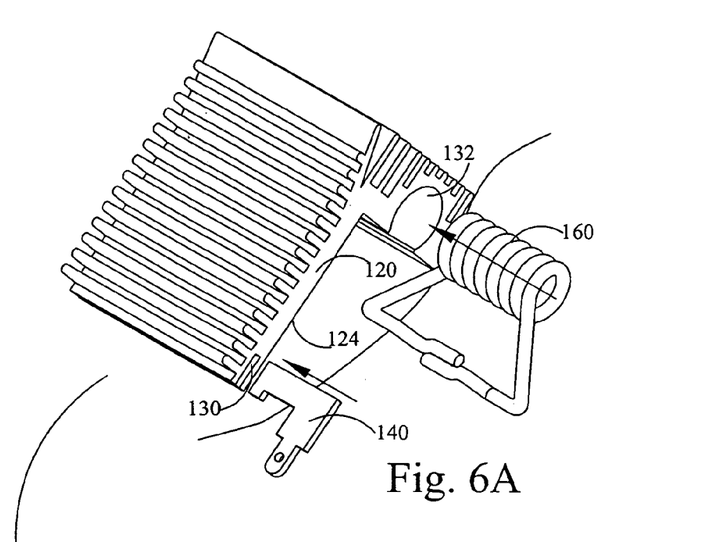
FIGS. 6A, 6B and 6C are the partial projective drawings of views illustrating how the base frame, spring clip and supporting member assembled together.
Figure 6B:
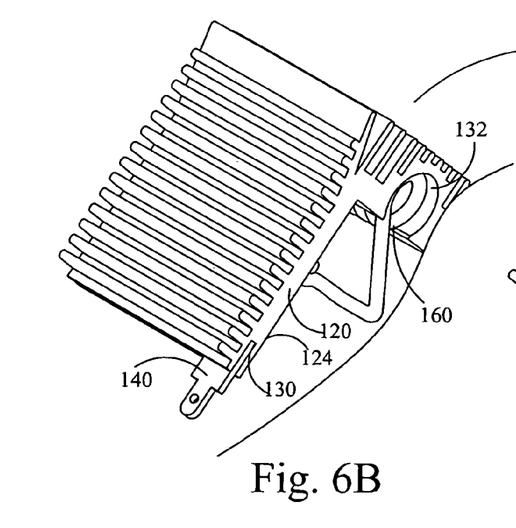
Figure 6C:
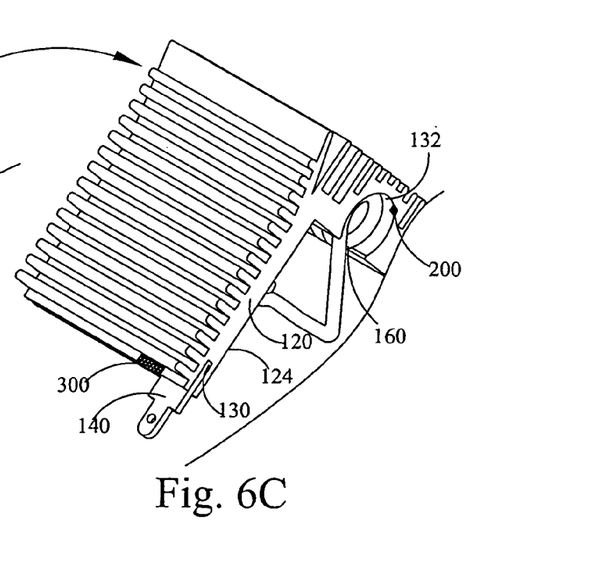

FIG. 2 and 3 are the perspective views of a heat sink apparatus constructed according to a preferred embodiment of the present invention. In FIG. 2 and 3 a heat sink apparatus 100 comprises a heat sink base frame 120, and a plurality of identical support members 140 and a plurality of spring clips 160. Heat sink base frame 120 is configured to have at least one channel 122 with two opposite sidewalls 124, 126 having a slot 130,with width "w" and a bottom side 128 intercepted with a cylindrical cut 132 with diameter "Φ". Heat sink base frame 120 is further configured to have extended surface areas or fins 134 attached or born to its outside surfaces for better heat dissipating. The fins 134 may be fabricated by extrusion, bonding, brazing, casting, machining or any other manufacturing methods with an inexpensive, better thermal conductive material, such as aluminum. Heat sink base frame 120 is preferably constructed of an inexpensive and better thermal conductive material, such as aluminum, and fabricated by extrusion, casting, machining and the like, preferably extrusion. The support member 140 is configured for insertion into apertures in a printed circuit or wiring board for attachment within a product, as by soldering, for example. To facilitate soldering attachment, the support member 140 is preferably constructed of solderable material, such as brass or steel with tin-plated. Accordingly, support members 140 are attached with heat sink base frame 120; such attachment may be effected by any convenient reliable attachment means, such as riveting, screwing, staking, pressing, adhesive or the like. In heat sink assembly 100, the attachment is effected by half shearing. Such attachment is illustrated in FIGS. 6A, 6B and 6C. The spring clip 160 is configured to be confined within heat sink base frame 120, having the degree of freedoms of sliding along and swinging about the axis of cylinder 132; such constrain, according to present invention, may be effected by sliding the clip 160 into cylindrical cut 132 then deforming the edges of both ends of cylindrical cut 132 to prevent clips sliding out as illustrated in FIGS. 6A, 6B and 6C. The deployment of spring clips 160 in a heat sink apparatus 100 is configured in such a way as an i×j matrix [i, j] set where i is the number of the spring clips transversally and the j is the number of the spring clips longitudinally as shown in FIGS. 1 and 2 which is a 2×2 matrix [2, 2] heat sink apparatus. The sprint clip 160 is preferably constructed of springy and resilient material, such as spring steel, sheet or wire, and fabricated by forming, stamping or any other inexpensive way.

Figure 4:
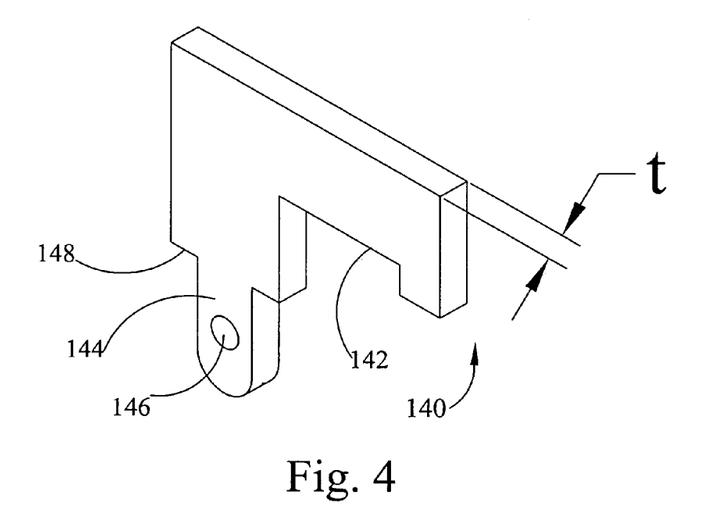
FIG. 4 is a perspective drawing of an embodiment of a supporting member.

FIG. 4 is a perspective view of support member 140 constructed according to a preferred embodiment of the present invention. The support member 140 is configured to be "L" shape having a notch 142 which is configured for receiving the sheared material, a tab 144 with a hole 146, and a shoulder 148. Shoulder 148 is configured for resting on the surface of a printed wiring or circuit board. Tab 144 is configured for insertion into apertures in a printed wiring or circuit board for attachment within a product. To facilitate insertion, tab 144 preferably has a chamfer or round end. Hole 146 is configured to bridge solders underneath a printed wiring or circuit board to increase mechanical strength. The thickness of the support member "t" is designed to be slightly smaller than the width "w" of slot 130 on heat sink base 120. The support member 140 is preferably constructed of solderable material, such as brass or steel with tin-plated and fabricated by stamping operation.

Figure 5A:
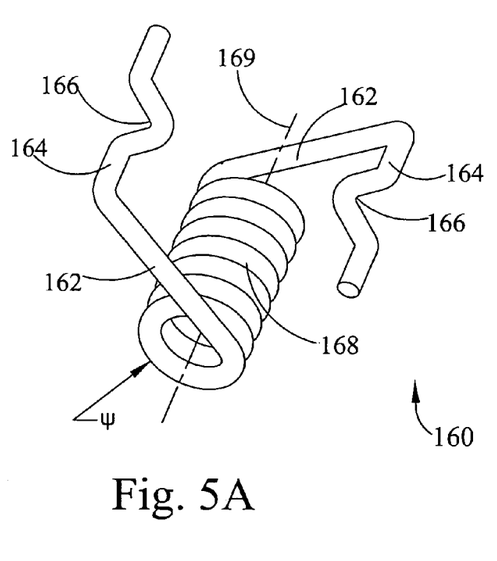
FIG. 5A is a perspective drawing of an embodiment of a spring clip.
Figure 5B:
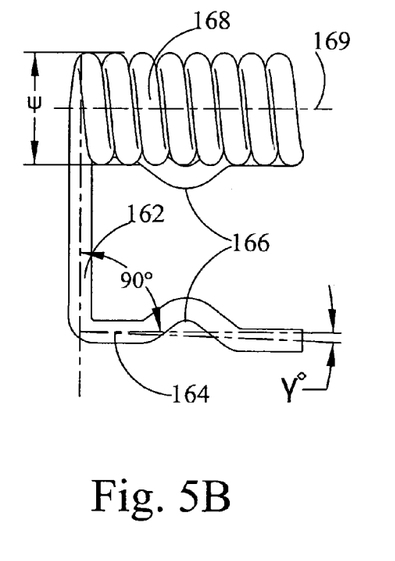
FIG. 5B is a projective view drawing of an embodiment of a spring clip

FIG. 5A and 5B are a perspective and projective views of spring clip 160 constructed according to a preferred embodiment of the present invention. The spring clip 160 may be manufactured from flat or round wire spring materials and is configured to be "helical torsion spring" like having a pair of moment arms 162 with cantilever beams 164, and tooling aperture 166 each on cantilever beams 164, and a coil 168 having an axis 169. The outside diameter "Ψ" of the coil 168 is designed to be slightly smaller than the inside diameter "Φ" of cylindrical cut 124. The moment arms 162 are configured to flex about axis 169. According to the present invention, the cantilever beams 164 are designed to be "pre-distorted". In other words, the cantilever beams 164 is not perpendicular to the moment arms 162 is, but tiled with a angle "ϒ" degree in order to apply an uniform pressure on electronic devices or components, one who is skill in the art may readily perform the stress analysis to determine the ϒ value of with the given clamping force.

FIG. 6A, 6B and 6C are a perspective partially exploded view of the heat sink assembly according to the present invention, showing how to assemble support member 140 and spring clip 160 onto a heat sink base 120 to effect the unitary connection between them. For simplicity, this view only takes one channel 122 for illustration. FIG. 6A shows the support member 140 and the spring clip 160 are sliding into its mating apertures, slot 130 and cylindrical cut 132, on heat sink base 120 respectively. FIG. 6B shows the support member 140 and the spring clip 160 are at the positions with heat sink base 120 after sliding in. FIG. 6C shows the shearing actions were taken to press the material of sidewall 124 into the notch 142 of support member 140 to create a sheared button 300 which stops supporting member 140 sliding back and forth, and to deform the edge of cylindrical cut 132 to create at least one bump 200 on each end, which prevents spring clip 160 sliding out so as to effect the unitary connection between supporting member 140, spring clip 160 and heat sink base 120. In other words, after this operation, supporting member 140 and spring clip 160 can no longer be taken apart from heat sink base 120 without destroying the heat sink assembly 100.

OPERATION

Figure 7A:
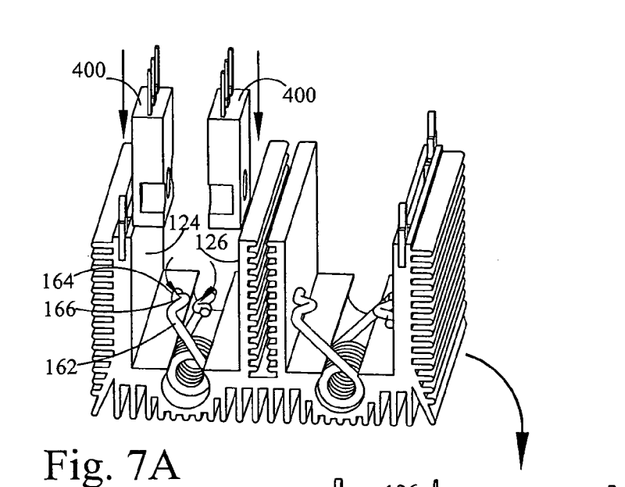
FIGS. 7A, 7B and 7C are the perspective drawings illustrating how to attach electronic components onto the heat sink apparatus of the present invention.

For operation, one can use the heat sink apparatus 100 in a normal manner by clipping the electronic components or devices onto the heat sink, and readily place the whole assembly 500 onto a printed circuit or wiring board for soldering operation like using any other electronic components. To clip electronic components or devices onto the heat sink apparatus 100, one should:

1). Turn the heat sink apparatus 100 upside down as shown in FIG. 7A

2). Rotate the moment arms 162 about its coil axis with a leverage tool in tooling apertures 166 so that there is a gap between the cantilever beam 164 and the sidewalls 124, 126 of channel 122 as shown in FIG. 7A.

Figure 7B:
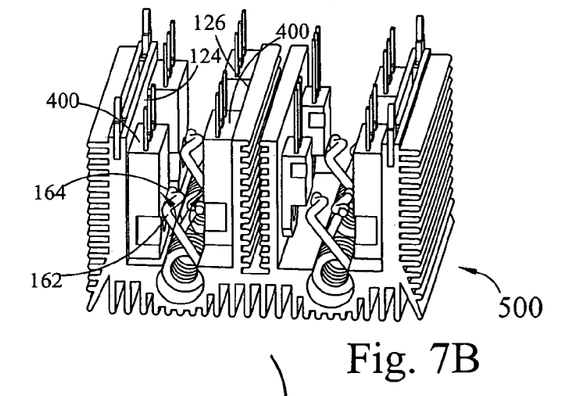

3). Slide the electronic components or devices 400 into the gaps and release the moment arms 162 so that the cantilever beam 164 can push the electronic components or devices against the sidewalls 124, 126 of channel 120 with certain pressure to effect the heat transfer from heat generating electronic components or devices to heat sink. There may be an electrical insulating pad (not shown here) between components or devices 400 and sidewalls 124, 126. The whole heat sink assembly 500 is created and comprises a heat sink apparatus 100 and plurality of electronic components or devices 400 as shown in FIG. 7B.

Figure 7C:
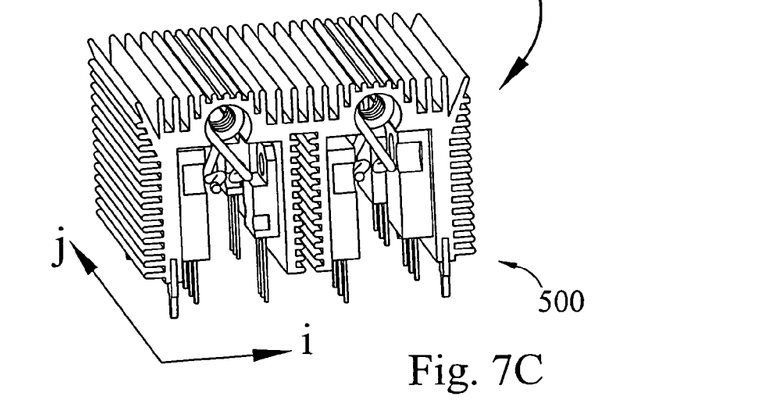

4). After finishing assembling the electronic components or devices onto heat sink, turn the hole assembly 500 upside as shown in FIG. 7C so it can be ready for plugging into a printed circuit or wiring board for soldering operation.

Figure 8A:
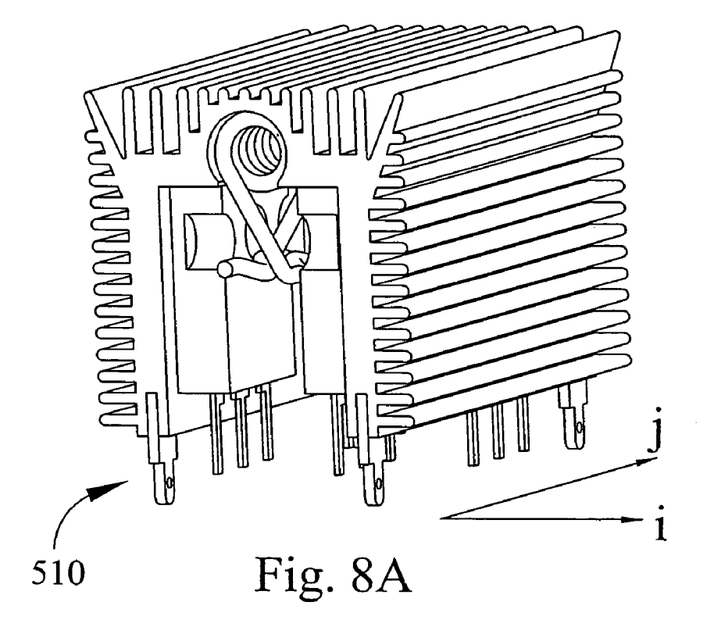
FIGS. 8A–8B are the perspective drawings of two different heat sink apparatus configurations of the embodiment of the present invention after assembly with electronic components.
Figure 8B:
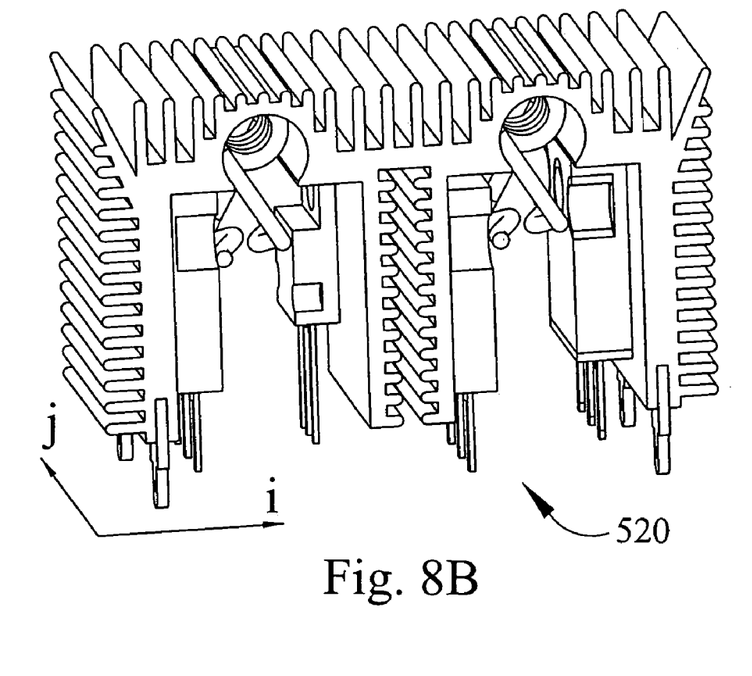

The user can, when desired, increase or decrease the numbers of the electronic components or devices 400 in the assembly by changing the matrix element i×j values or number of spring clip 160, with the changing of the matrix[i, j] element (i, j) values, the heat sink apparatus 100 can be configured so that it can be mounted onto a printed circuit or wiring board universally. For example a 1×2 matrix[1, 2] heat sink assembly 510, as shown in FIG. 8A, can be mounted transversely and a 2×1 matrix[2, 1] heat sink assembly 520, as shown in FIG. 8B, can be mounted longitudinally without the need to change the airflow direction coming from a fan or a blower.

Obviously the present invention provides the heat sink apparatus with advantages as listed below:

1). Configurable and scalable
2). Universal mountable
3). Ease of assembly
4). Efficient
5). Ease of manufacturing Although only a few embodiments of the present invention have been described, it should be understood that the present invention be embodied in many other specific forms without departing from the spirit or the scope of the present invention. The present examples are to be considered as illustrative and not restrictive, and the invention is not to be limited to the details given herein, but may be modified within the scope of the appended claims along with their full scope of equivalents.

I claim:

1. A heat sink apparatus for use with at least one electronic component; the apparatus comprising:

(a) a base frame;
(b) a clipping system; and
(c) a plurality of supporting members;

said base frame and said clipping system and said supporting members being of unitary construction; said clipping system comprising a matrix [i, j] set of spring clips; said spring clip partially constrained inside of said base frame and configured to flex about at least one axis resiliently to effect an engaged relation with said base frame; said base frame and said spring clip cooperating in said engaged relation to substantially fixedly maintain said at least one electronic component in abutting relation with said base frame; said supporting members configured having fixed connection with said base frame.

2. A heat sink apparatus for use with at least one electronic component as recited in claim 1 wherein said base frame comprising at least one channel intercepted with a diameter (Φ) cylindrical cut; said channel intercepted with a diameter (Φ) cylindrical cut can repeat transversely with i as the number of repeats.

3. A heat sink apparatus for use with at least one electronic component as recited in claim 2 wherein said channel intercepted with a cylindrical cut including outside surfaces and inside surfaces and at least one slot on one side wall of said channel.

4. A heat sink apparatus for use with at least one electronic component as recited in claim 3 wherein said outside surfaces of said channel usually having fins attached or born thereto.

5. A heat sink apparatus for use with at least one electronic component as recited in claim 3 wherein said the two opposite inside wall surfaces of said channel being heat conducting surface areas.

6. A heat sink apparatus for use with at least one electronic component as recited in claim 3 wherein said slot on one side of said channel having a width "w".

7. A heat sink apparatus for use with at least one electronic component as recited in claim 1 wherein said clipping system comprising i×j spring clips; said i×j spring clips being deployed inside of said base frame in a matrix [i, j] pattern.

8. A heat sink apparatus for use with at least one electronic component as recited in claim 7 wherein said spring clip being configured like torsion spring having a helical body with outside diameter (Ψ), two moment arms and two cantilever beams.

9. A heat sink apparatus for use with at least one electronic component as recited in claim 8 wherein said cantilever beam including tooling apertures and pre-distortion mechanism to effect uniform pressure on said electronic component.

10. A heat sink apparatus for use with at least one electronic component as recited in claim 8 wherein said outside diameter (Ψ) of spring clip body is slighter smaller than said cylindrical cut diameter (Φ) of said base frame.

11. A heat sink apparatus for use with at least one electronic component as recited in claim 1 wherein said spring clip configured to cooperatively engage a corresponding said cylindrical cut in said base frame so that said moment arm of said spring clip is able to swing about its axis; therefore said cantilever beam of said moment arm to substantially fixedly maintain said at least one electronic component in abutting relation with said heat conducting surface areas.

12. A heat sink apparatus for use with at least one electronic component as recited in claim 1 wherein said supporting member configured being like "L" shape including a notch on one arm and a hole on the other and having a thickness "t".

13. A heat sink apparatus for use with at least one electronic component as recited in claim 12 wherein said thickness "t" of said supporting member is slightly smaller than said slot width "w" on one side of said channel.

14. A heat sink apparatus for use with at least one electronic component as recited in claim 12 wherein said supporting members configured to cooperatively engage a corresponding said slot on said base frame with said fixed connection.

15. A heat sink apparatus for use with at least one electronic component; the apparatus comprising:
(a) a base frame;
(b) a clipping system;
(c) a plurality of supporting members; and
(d) means for joining said supporting members underside;
said base frame and for partially constraining said spring clips inside said base frame; said base frame and said clipping system and said supporting members being of unitary construction; said clipping system comprising a matrix [i, j] set of spring clips; said spring clip partially constrained inside of said base frame and configured to flex about at least one axis resiliently to effect an engaged relation with said base frame; said base frame and said spring clip cooperating in said engaged relation to substantially fixedly maintain said at least one electronic component in abutting relation with said base frame; said supporting members configured having fixed connection with said base frame; said means for said unitary construction of said base frame and said clipping system and said supporting members being very economical.

16. A heat sink apparatus for use with at least one electronic component as recited in claim 15 wherein said economic means including machineless and fixtureless assembly operations.

17. A heat sink apparatus for use with at least one electronic component as recited in claim 16 wherein said assembly operations including deforming, half-sheared and swaging.

18. A heat sink apparatus for use with at least one electronic component; the apparatus comprising:
(a) a base frame;
(b) a clipping system;
(c) a plurality of supporting members;
(d) means for joining said supporting members underside said base frame and for partially constraining said spring clips inside said base frame; and
(e) changeable capacities of holding said electronic components;
said base frame and said clipping system and said supporting members being of unitary construction; said clipping system comprising a matrix [i, j] set of spring clips; said spring clip partially constrained inside of said base frame and configured to flex about at least one axis resiliently to effect an engaged relation with said base frame; said base frame and said spring clip cooperating in said engaged relation to substantially fixedly maintain said at least one electronic component in abutting relation with said base frame; said supporting members configured having fixed connection with said base frame; said means for said unitary construction of said base frame and said clipping system and said supporting members being very economical; said changeable capacities of holding said electronic components being scalable.

19. A heat sink apparatus for use with at least one electronic component as recited in claim 18 wherein said scalable capacities of holding said electronic components configured in both transverse and longitudinal directions.

20. A heat sink apparatus for use with at least one electronic component as recited in claim 19 wherein said scalable capacities of holding said electronic components being made possible by the cooperation of said i channel base frame and said matrix [i, j] clipping system.

* * * * *